(12) United States Patent
Filoramo et al.

(10) Patent No.: US 7,405,608 B2
(45) Date of Patent: Jul. 29, 2008

(54) MODULATOR APPARATUS OPERATING AT LOW SUPPLY VOLTAGE, AND CORRESPONDING METHOD OF MODULATION

(75) Inventors: Pietro Filoramo, Syracuse (IT); Alberto Cavallaro, Catania (IT); Tiziano Chiarillo, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 17 days.

(21) Appl. No.: 11/619,750

(22) Filed: Jan. 4, 2007

(65) Prior Publication Data

US 2007/0200622 A1    Aug. 30, 2007

(30) Foreign Application Priority Data

Jan. 5, 2006    (IT)    ............................ TO2006A0008

(51) Int. Cl.
*G06F 7/44*    (2006.01)
(52) U.S. Cl. ....................................... 327/359; 327/563
(58) Field of Classification Search ................. 327/355, 327/356, 358, 359, 538, 543, 560, 563
See application file for complete search history.

(56) References Cited

U.S. PATENT DOCUMENTS 5,172,079 A    12/1992    Shigenari .................... 332/168
5,884,154 A *    3/1999    Sano et al. .................. 455/321
6,650,883 B1 *    11/2003    Stephane et al. ............ 455/313

* cited by examiner

*Primary Examiner*—Jeffrey S Zweizig
(74) *Attorney, Agent, or Firm*—Lisa K. Jorgenson; Robert Iannucci; Seed IP Law Group PLLC

(57) ABSTRACT

A modulator apparatus operating at a low supply voltage, configured for receiving an input-voltage signal in base band and supplying an output-voltage signal at a given modulation frequency under control of a signal generated by a local oscillator and comprising a transconductor stage that carries out a voltage-to-current conversion of said input-voltage signal. A voltage-to-current conversion module is coupled to a current-mirror module configured for mirroring a current in a Gilbert-cell stage, which supplies an output-voltage signal under the control of said signal generated by the local oscillator. The Gilbert-cell stage further comprises an output load for carrying out a current-to-voltage conversion and supplying the output-voltage signal. Said transconductor stage further comprises a differential feedback network configured for reproducing said input-voltage signal on a differential load included in said voltage-to-current conversion module.

21 Claims, 4 Drawing Sheets

MODULATOR APPARATUS OPERATING AT LOW SUPPLY VOLTAGE, AND CORRESPONDING METHOD OF MODULATION

BACKGROUND OF THE INVENTION

1. Field of the Invention

The present description relates to apparatuses and methods for modulation of base-band signals into signals operating at given frequencies, in particular radio-frequency.

2. Description of the Related Art

The tendency of the market of microelectronic devices of presenting increasingly high levels of performance at extremely contained costs, as well as the concentration of an increasingly higher number of functions in portable devices, intensifies the demand for devices that involve a low power consumption. Said requirements are met via the use of high-efficiency CMOS technological processes with sub-micrometric channel lengths, which, however, on account of certain technological constraints, require very low supply voltages. All of these elements have in general a marked impact on the design of analog circuits, and frequently impose the use of non-conventional structures.

One of the circuit blocks that is most affected by the new constraints of supply voltage is the transmission mixer (or modulator), which performs the function of converting to radio-frequency (RF) the low-frequency signal coming from the base-band (BB) circuit, with a conversion gain generally not lower than 0 dB. In addition, since the most modern modulation systems (CDMA, WLAN, etc.), characterized by encodings that generate instantaneously input signals of high amplitude, the use is necessary of circuit topologies with high input dynamic ranges.

In what follows, known architectures for transmission modulators will be described, evaluating, for each of them, the minimum supply voltage that can be used, the corresponding power consumption, and the levels of performance.

FIG. 1 represents a circuit diagram of a modulator apparatus, designated as a whole by the reference number 10, representing the topology most widely used for the transmission modulator.

As can be also appreciated in what follows, the modulator apparatus 10 basically comprises two branches corresponding to the two input nodes a and b applied on which is an input-voltage base-band differential signal $V_{in}$ to be modulated. The modulator apparatus described here and the ones illustrated in what follows present a symmetrical architecture on said branches; hence, elements that are the same associated to each of said branches will be distinguished by the subscripts a and b.

Said modulator apparatus 10 hence comprises a conversion module 20, which, in this case, constitutes autonomously a transconductor stage. Said conversion module 20, as has been mentioned, receives the input-voltage band-base signal $V_{in}$ on the nodes a and b from an band-base operating apparatus (not shown in FIG. 1). The nodes a and b correspond to the gate electrodes of respective conversion transistors $M_{1a}$ and $M_{1b}$, of a MOSFET type, equipped with respective degeneration resistances, $R_{EEa}$ and $R_{EEb}$, connected between their source electrode and ground. The drain electrodes of said conversion transistors $M_{1a}$ and $M_{1b}$ constitute the current outputs of the transconductor stage 20.

The modulator apparatus 10 represented in FIG. 1 is a modulator of the so-called "stacked" type, in so far as the transconductor stage 20 shares the biasing current with a Gilbert-cell stage 30, also referred to as "Gilbert Quad". Said Gilbert cell 30 is of the double-balanced type and hence comprises a first pair of transistors $M_{Qa}$ and $M_{Qb}$ having their source electrode in common, as well as a second pair of transistors $M_{Qc}$ and $M_{Qd}$ connected in a similar way. A differential control signal $V_{LO}$, produced by a local oscillator (not represented in FIG. 1 either), is sent at input to the gate electrodes, associated in a common node, of the transistors $M_{Qb}$ and $M_{Qc}$. The drain electrodes of the transistors $M_{Qa}$ and $M_{Qd}$, according to the known circuit diagram of the balanced Gilbert cell, are connected to the drain electrodes, respectively, of the transistor $M_{Qc}$ and of the transistor $M_{Qb}$, and are also connected to the supply voltage $V_{DD}$ via respective load resistances $R_{La}$ and $R_{Lb}$, which convert the current into voltage and across which the output-voltage signal $V_{out}$ is then taken, whilst the Gilbert cell 30 is connected to the output of the transconductor stage 20 by means of the source electrodes of the first pair of transistors $M_{Qa}$ and $M_{Qb}$ and of the second pair of transistors $M_{Qc}$ and $M_{Qd}$, associated, respectively, to the drain electrode of the conversion transistors $M_{1a}$ and $M_{1b}$. Functionally the transconductor stage 20 carries out voltage-to-current conversion of the input-voltage signal $V_{in}$ supplied by the base-band circuit, whilst the Gilbert cell 30, stimulated by the control signal $V_{LO}$ coming from the local oscillator thereof carries out the frequency conversion. The resulting RF current signal is then converted into the output-voltage signal $V_{out}$ through the output load determined by the load resistances $R_{La}$ and $R_{Lb}$.

From simple circuit considerations the following approximate expressions are obtained for a minimum supply voltage $V_{DDmin}$ allowed and for a current consumption $I_{SUPPLY}$ of the modulated apparatus 10 of FIG. 1:

$$V_{DDmin} = V_{in} + V_{DSmin} + \frac{V_{LO}}{2} + V_{DSmin} + \frac{V_{in} \cdot G \cdot \pi}{4} + \frac{V_{in} \cdot G}{2} \quad (1)$$

$$I_{SUPPLY} = \frac{\pi \cdot V_{in} \cdot G}{2 \cdot R_L} \quad (2)$$

Clearly, in Eq. (1) of the input-voltage signal $V_{in}$ the peak value is used, as likewise of the control signal $V_{LO}$ coming from the local oscillator the amplitude is used. The reference $V_{DSmin}$ designates a minimum value of the drain-to-source voltage at which the MOSFETs operate in the saturation region. The reference G designates the input-output voltage conversion gain of the modulator apparatus 10 (V/V), and $R_L$ corresponds to the value of the load resistor $R_{La,b}$.

In order to simplify evaluation of the different known topologies of modulators and to compare them with the solution proposed, for each architecture the numeric value of the minimum supply voltage $V_{DDmin}$ and of the current consumption $I_{SUPPLY}$ is calculated assuming the following set of circuit parameters:

$G=1(0 \text{ dB})$, $V_{in}(\text{peak})=400$ mV, $R_{La,b}=100$ Ω,
$V_{DSmin}=200$ mV, $V_{LO}(\text{peak})=500$ mV, $V_{TH}=500$
mV, $V_{GS}=600$ mV. (3)

The above set (3) of circuit parameters is provided purely by way of example and as tool useful for performing a rapid comparison through a reasonable example of application. It does not constitute, hence, a limitation of the field of use of the invention.

By substituting in Eqs. (1) and (2) the values of the set of parameters (3) it is obtained a minimum supply voltage $V_{DDmin}$ of 1.56 V, a minimum current consumption $I_{SUPPLY}$ of 8 mA, and a respective dissipated power of 9.8 mW.

It should be noted how, even though the biasing current is shared between the transconductor stage 20 and the Gilbert cell 30, which operates as mixer, the power consumption is relatively high. In addition, the minimum value of supply voltage $V_{DDmin}$ that guarantees operation of said circuit topology is rather high, and this constitutes an even more limiting factor for modern sub-micrometric technologies.

FIG. 2 shows a modulator apparatus 110 made according to another known architecture, the so-called "folded mixer" architecture. In a way similar to the apparatus 10 of FIG. 1, the modulator apparatus 110 comprises a transconductor stage 120 followed by the Gilbert cell 30. However, the transconductor stage 120 comprises a voltage-to-current conversion module 20 set with the drain electrodes of the transistors $M_{1a}$ and $M_{1b}$ connected to current generators $I_a$ and $I_b$, which are in turn connected to the supply voltage $V_{DD}$. In turn, the Gilbert cell 30 has its own load resistor $R_{La}$ and $R_{Lb}$ connected to the ground node. This enables improvement in the voltage dynamic range both of the input signal and of the output signal. The current generators $1_a$ and $1_b$ have the dual function of supplying the biasing current to both of the functional sub-blocks, i.e., the transconductor stage 20 and the Gilbert cell 30, and of maximizing the signal transfer thereof thanks to their intrinsic high output impedance.

The modulator apparatus 110 of FIG. 2 enables very low supply voltages. In fact, the expressions of the minimum supply voltage $V_{DDmin}$ allowed and of the corresponding current consumption $I_{SUPPLY}$ are:

$$V_{DDmin} = V_{DSmin} + \frac{V_{LO}}{2} + V_{DSmin} + \frac{V_{in} \cdot G \cdot \pi}{4} + \frac{V_{in} \cdot G}{2} \quad (4)$$

$$I_{SUPPLY} = \frac{\pi \cdot V_{in} \cdot G}{R_L} \quad (5)$$

From a comparison of Eq. (4) with Eq. (1) and of Eq. (5) with Eq. (2) it emerges that, however advantageous the folded-mixer architecture may be in terms of dynamic range, and hence of minimum supply voltage allowed, it presents a current consumption that is double with respect to the architecture represented in FIG. 1.

In fact, if the set of parameters (3) is inserted in Eqs. (4) and (5), it is obtained a minimum supply voltage $V_{DDmin}$ of 1.16 V, but a minimum current consumption $I_{SUPPLY}$ of 12.56 mA, which in practice corresponds to a dissipated power of 14.6 mW. It hence follows that, even though the circuit topology of FIG. 2 is suitable for low-supply-voltage applications, it does not enable a very contained power dissipation, which is a fundamental parameter for portable applications.

FIG. 3 represents a modulator apparatus 210 made according to a so-called "Gm-folded" architecture. A substantially similar modulator apparatus is also known from the document U.S. Pat. No. 5,172,079.

In said circuit configuration a transconductor stage 220 comprises the usual voltage-to-current conversion module 20, comprising the conversion transistors $M_{1a}$ and $M_{1b}$, in this case PMOS transistors, associated to corresponding degeneration resistor $R_{EEa}$ and $R_{EEa,b}$, set connected between their source electrodes and the supply voltage $V_{DD}$. In addition, the transconductor stage 220 comprises in this case a first current mirror 225, connected to the drain electrode of the conversion transistor $M_{1a}$ and made up of the transistors of $M_{2a}'$ and $M_{2a}''$, and a second current mirror 226, connected to the source electrode of the transistor $M_{2a}$ and made up of the transistors $M_{2b}'$ and $M_{2b}''$. The current mirrors 225 and 226 mirror the current in the Gilbert cell 30, that is, of the type similar to the one illustrated with reference to FIG. 1. The mirror factor N of the current mirrors 225 and 226, defined as ratio between the aspect ratio of their transistors, is generally identified as a compromise between current consumption and output noise.

The expressions of the minimum supply voltage $V_{DDmin}$ and of the current consumption $I_{SUPPLY}$ for the modulator apparatus 210 according to the Gm-folded topology are:

$$V_{DDmin} = MAX \begin{cases} V_{DSmin} + \frac{V_{LO}}{2} + V_{DSmin} + \frac{V_{in} \cdot G \cdot \pi}{4} + \frac{V_{in} \cdot G}{2} \\ V_{in} + V_{DSmin} + V_{GS} \end{cases} \quad (6)$$

$$I_{SUPPLY} = \frac{N+1}{N} \cdot \frac{\pi \cdot V_{in} \cdot G}{2 \cdot R_L} \quad (7)$$

By substituting the set of parameters (3) in the above Eqs. (6) and (7) and setting the mirror ratio N to 5, we obtain a minimum supply voltage $V_{DDmin}$ of 1.2 V and a current consumption $I_{SUPPLY}$ of 7.54 mA, which in practice correspond to a dissipated power of 9 mW. Therefore, in this case, the circuit topology is satisfactory both from the standpoint of the minimum supply voltage allowed (even though it is not the minimum amongst the architectures proposed) and from the standpoint of the associated power dissipation. On the other hand, however, it presents a series of disadvantages that reduce the aforesaid advantages in the actual definition of the circuit. In fact, since the mirrors used in the transconductor are "simple", i.e., not in "cascode" configuration, on account of the phenomenon of channel modulation, the transfer of signal, as likewise the replica of the biasing current, are markedly dependent upon the differences in the drain-to-source voltages between the transistors $M_{2a}'$ and $M_{2a}''$, as well as $M_{2b}'$ and $M_{2b}''$. In addition, on account of the rectification of the signal coming from the local oscillator on the source electrodes of the transistors of the Gilbert cell, the differences between said drain-to-source voltages of the transistors $M_{2a}'$-$M_{2a}''$ and $M_{2b}'$-$M_{2b}''$ are also a function both of the biasing voltage of the Gilbert cell 20 and of the amplitude of the control signal $V_{LO}$ of the local oscillator. Said elements unfavorably affect the transfer of signal and determine a lack of accuracy of the conversion gain of the modulator apparatus; this represents in general a limit for completely integrated circuit applications. Furthermore, even though the effect of channel modulation can be mitigated by the use of long-channel MOS devices, since the constraints on the input and output dynamic ranges (low overdrive→high shape ratio W/L) impose the use of high shape factors, this results in large parasitic capacitances at the drains of the transistors $M_{2a}''$ and $M_{2b}''$, with consequent high feed-through of the local oscillator.

BRIEF SUMMARY OF THE INVENTION

One embodiment of the present invention solves the drawbacks described above and proposes a solution that enables operation with a low value of minimum supply voltage and at low consumption levels, controlling way the gain in a precise, in particular in a way that presents low sensitivity in regard to the phenomenon of channel modulation.

One embodiment of the present invention is an apparatus having the characteristics recalled in the claims, which form an integral part of the technical teachings regarding embodiments of the invention. One embodiments of the present invention regards also a corresponding method of modulation.

BRIEF DESCRIPTION OF THE SEVERAL VIEWS OF THE DRAWINGS

Embodiments of the invention will now be described, purely by way of non-limiting example, with reference to the figures of the annexed plate of drawings, wherein.

DETAILED DESCRIPTION OF THE INVENTION

In brief, a modulator apparatus and a corresponding method of modulation are proposed, which envisage providing in the transconductor stage a feedback of a differential type for reproducing the input signal on the differential load, and a common-mode feedback so that the gain of the current mirror will be extremely accurate and will behave equivalently to a cascode mirror.

Figure 4:
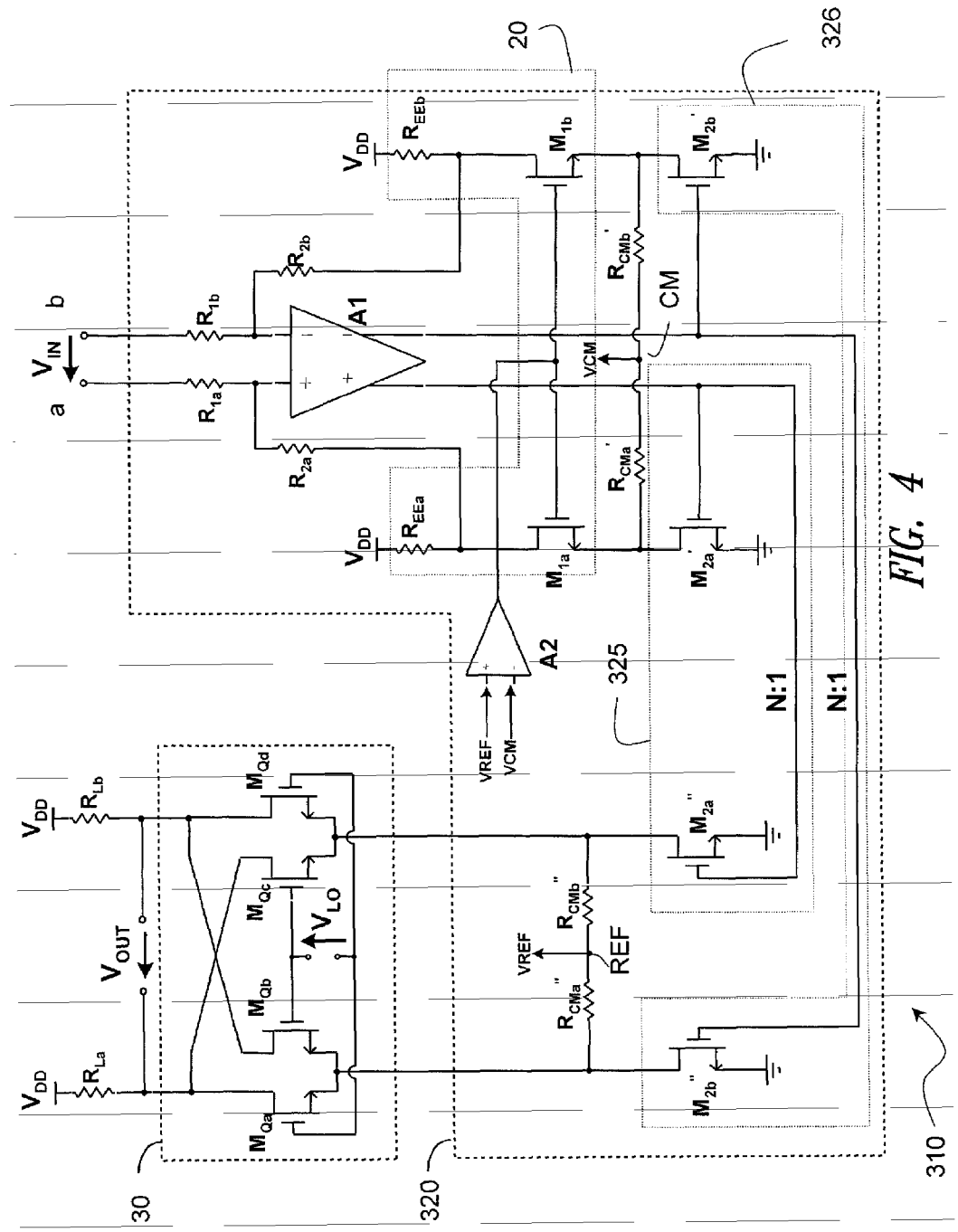
FIG. 4 shows an embodiment of a modulator apparatus according to one embodiment of the invention.

FIG. 4 represents a circuit implementation of the modulator apparatus proposed, designated as a whole by the reference number 310.

Figure 1:
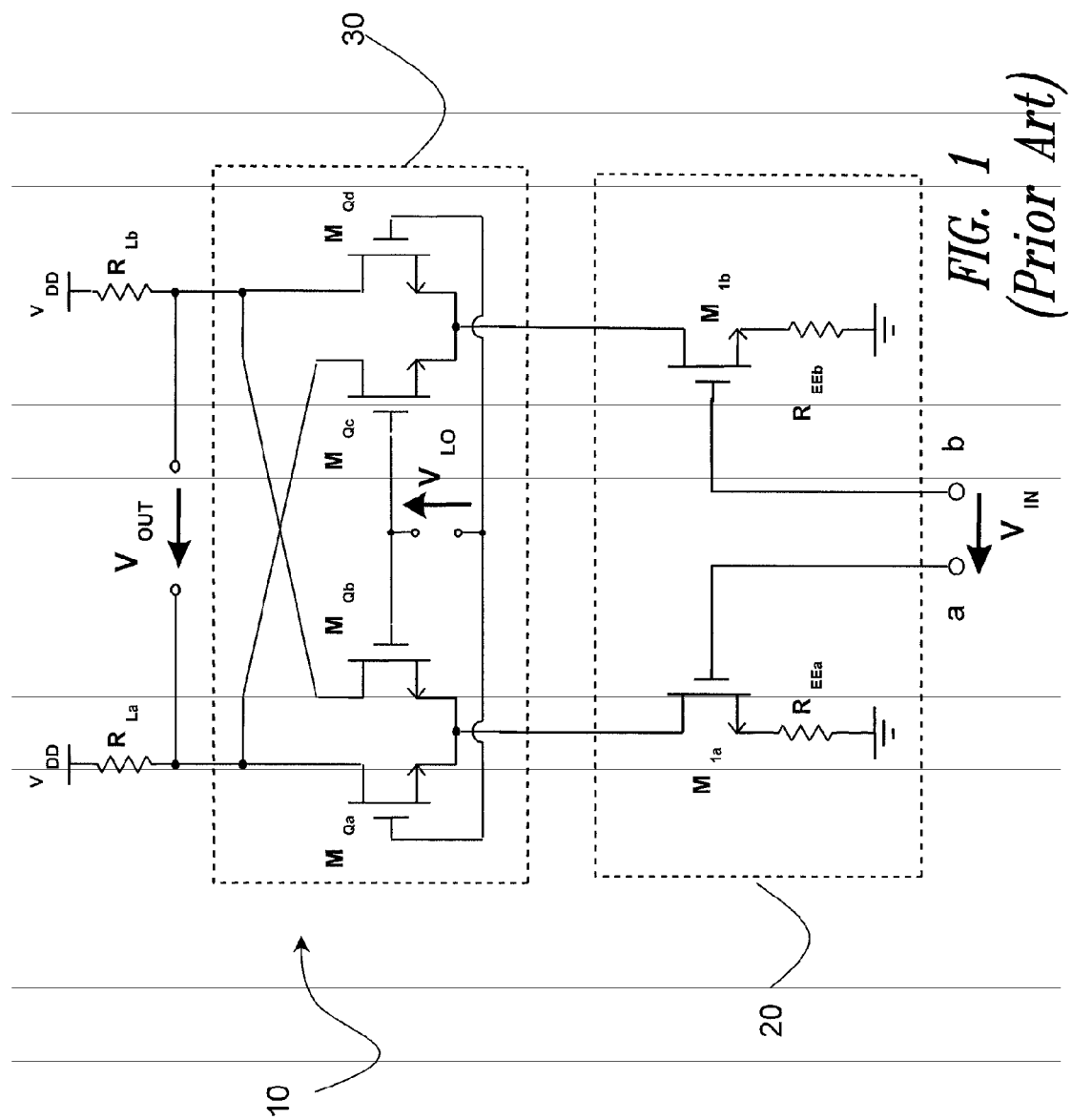
FIGS. 1, 2 and 3, which regard known apparatuses, have already been described in the foregoing.
Figure 2:
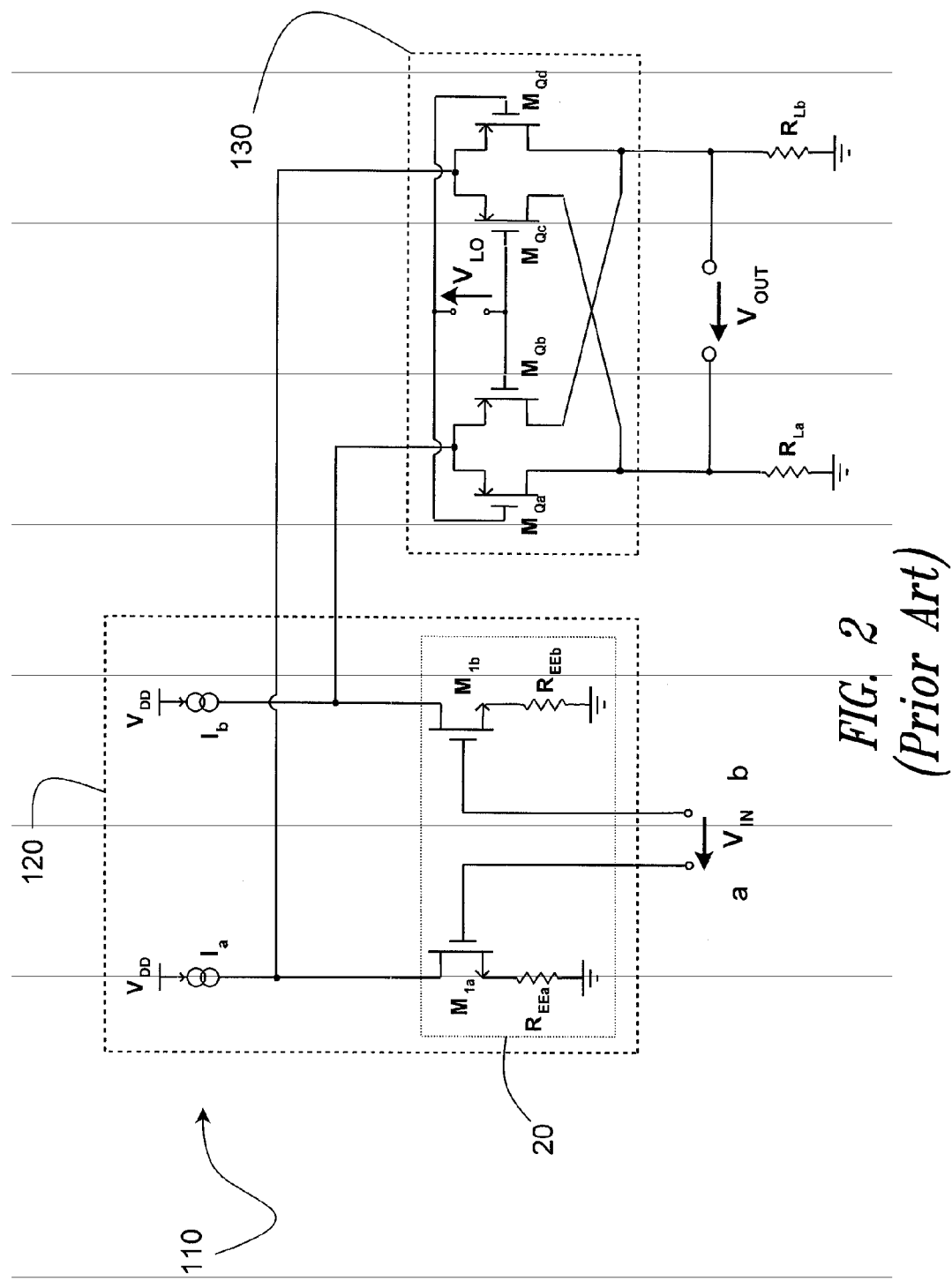
Figure 3:
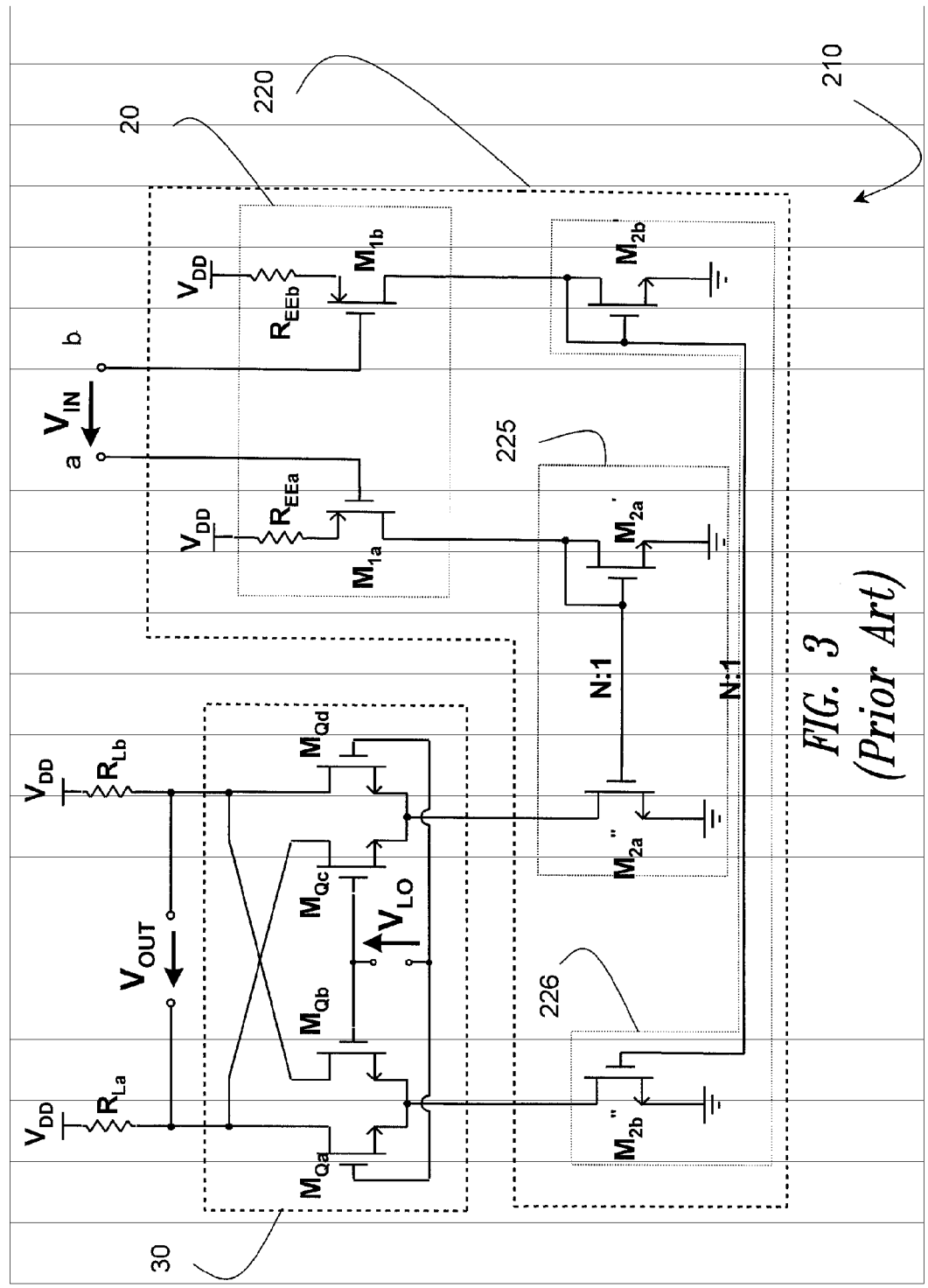

Said modulator apparatus 310 comprises a transconductor stage 320, which carries out the voltage-to-current conversion of the input-voltage signal $V_{in}$ supplied by the base-band circuit. Associated to the output of the transconductor stage 320 is a Gilbert cell 30, similar to the ones shown in FIGS. 1 and 3. Said Gilbert cell 30, stimulated by the control signal $V_{LO}$ coming from a local oscillator, which is not shown here either, carries out the conversion to the higher radio-frequency, or a frequency up-conversion, of the current signal, which is then transformed into an output-voltage signal $V_{out}$ by means of the output load, which is represented schematically in FIG. 4 by the resistances $R_{La}$ and $R_{Lb}$.

As has been said, the transconductor stage 320 carries out the voltage-to-current conversion by means of the pairs of transistors $M_{1a}$-$M_{1b}$ and $M_{2a}'$ and $M_{2b}'$, and of the respective degeneration resistor $R_{EEa}$ and $R_{EEb}$ connected between the drain electrodes of the transistors $M_{1a}$ and $M_{1b}$ and the supply voltage $V_{DD}$. However, in the transconductor stage 320, a differential amplifier A1 is connected to the input nodes a and b and hence receives at its input terminals the input-voltage signal $V_{in}$. The outputs of said differential amplifier A1 controls the gate terminals of the transistors $M_{2a}'$ and $M_{2b}'$, which, in turn, generate a differential current signal, which traverses the transistors $M_{1a}$ and $M_{1b}$, arranged in common-gate configuration, and finally generates, on the differential load constituted by the degeneration resistor $R_{EEa}$ and $R_{Eeb}$, a signal proportional to the input signal $V_{IN}$. The transconductor stage 320 comprises in fact a differential-feedback network, which includes the conversion transistors $M_{1a}$ and $M_{1b}$ and the degeneration resistor $R_{EEa,b}$, which are connected to the input signal $V_{in}$ via resistance dividers $R_{1a}$-$R_{2a}$ and $R_{1b}$-$R_{2b}$ on the input terminals of the differential amplifier A1. The source electrodes of the conversion transistors $M_{1a}$ and $M_{1b}$ are moreover connected to the drain electrodes of the transistors $M_{2a}'$ and $M_{2b}'$. Departing from said drain electrodes are moreover respective first common-mode resistances $R_{CMa}'$ and $R_{CMb}'$, which connect up in a common-mode node CM. On said common-mode node CM a common-mode voltage $V_{CM}$ is set up. Likewise, departing from the drain electrodes of the transistors $M_{2a}''$ and $M_{2b}''$ are respective second common-mode resistances $R_{CMa}''$ and $R_{CMb}''$, which connect up in a reference node REF. On said reference node REF a reference voltage $V_{REF}$ is set up. The reference voltage $V_{REF}$ and common-mode voltage $V_{CM}$ constitute the inputs of a second differential amplifier A2, the output of which is connected to the gate electrodes of the common-gate transistors $M_{1a}$ and $M_{1b}$. Consequently, the first and second common-mode resistances, the transistors of the current mirrors 325 and 326, as well as the second differential amplifier A2 configure a common-mode feedback.

If we assume for simplicity of exposition that, as regards the values of the resistances, we have $R_{2a}=R_{1a}>>R_{EEa}$ and $R_{2b}=R_{1b}>>R_{EEb}$, it may be noted from an examination of the transconductor stage 320 that the function of the differential feedback is to reproduce faithfully the input-voltage signal $V_{IN}$ on the differential load constituted by the degeneration resistor $R_{EEa}$ and $R_{EEb}$ through direct control of the differential voltage applied to the gates of the transistors $M_{2a}'$, $M_{2b}'$. In addition, as a result of the resistances $R_{EEa,b}$, the differential current supplied by the transistors $M_{1a}$, $M_{1b}$ is directly proportional to the differential-voltage signal across the resistances themselves. Said differential-current signal is then mirrored, with a mirror ratio N:1, defined by the ratio between the shape factors of the transistors $M_{2a,b}'$-$M_{2a,b}''$, on the circuit branches which arrive at the Gilbert cell 30. The presence of the common-mode feedback, performed by the operational amplifier A2, ensures that the current mirror is extremely accurate and will behave equivalently to a cascode mirror. In fact, the common-mode feedback controls the biasing voltage of the gate of the transistors $M_{1a}$ and $M_{1b}$ so as to nullify the difference between the reference voltage $V_{REF}$ and common-mode voltage $V_{CM}$ at its input. The advantage that derives therefrom is that, irrespective of the signal-rectification effect on the source of the transistors of the Gilbert cell 30, the mean value of the differences between the drain-to-source voltages of the transistors $M_{2a}'$-$M_{2a}''$ and $M_{2b}'$-$M_{2b}''$ is zero, and, consequently, the modulator apparatus 310 is not affected by the problems of accuracy of conversion gain. Furthermore, said improvement in the accuracy of the current mirror introduced by the common-mode feedback makes it possible to use small channel lengths for the transistors of one and the same mirror, to the advantage of the dynamic range, the speed of the transconductor stage, and, seeing that the overall capacity on the drain electrodes of the transistors $M_{2a}''$ and $M_{2b}''$ of the second current mirror 326 can be consequently rendered negligible, also to the advantage of the feed-through of the local oscillator.

The expressions of the minimum supply voltage $V_{DD}$ and of the current consumption $I_{SUPPLY}$ of the invention proposed are the following:

$$V_{DD} = \text{MAX}\begin{cases} V_{DSmin} + \dfrac{V_{LO}}{2} + V_{DSmin} + \dfrac{V_{in} \cdot G \cdot \pi}{4} + \dfrac{V_{in} \cdot G}{2} \\ V_{in} + V_{DSmin} + V_{DSmin} \end{cases} \quad (8)$$

$$I_{SUPPLY} = \frac{N+1}{N} \cdot \frac{\pi \cdot V_{in} \cdot G}{2 \cdot R_L} \quad (9)$$

By substituting the set of parameters (3) in Eqs. (8) and (9), and setting the mirror ratio N to 5, it is obtained a minimum supply voltage $V_{DD}$ of 1.16 V and a current consumption of 7.54 mA, to which there in practice corresponds a dissipated power of 8.75 mW.

Hence, the proposed embodiment is an improvement compared to the ones examined in the known art both as regards the minimum supply voltage and as regards power consumption, and moreover presents multiple advantages that reflect positively on the feed-through and on the accuracy of the conversion gain.

Consequently, without prejudice to the principle of the invention, the details of construction and the embodiments may vary, even significantly, with respect to what is described and illustrated herein, purely by way of non-limiting example, without thereby departing from the scope of the invention, as defined in the ensuing claims.

For example, with respect to the embodiment described, the resistances can be replaced by generic impedances, and the output load, which is resistive, can be replaced by a generic load, e.g., an active load, an inductive passive load, etc.

The architecture proposed can be used satisfactorily both for providing individual modulators and for providing I/Q modulators.

In addition, one embodiment can be applied also as down-converter in the receiver chain of modules in certain dual-conversion applications, provided that the input intermediate frequency (IF) is sufficiently low as compared to the band-gain product of the differential amplifier.

Even though the circuit described above has been developed using only NMOS transistors, the invention can be extended also to the use of bipolar transistors, with BiCMOS approach, and of dual architectures (PMOS transistors, pnp transistors).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A modulator apparatus operating at a low supply voltage, configured for receiving an input-voltage signal from a base band circuit and supplying an output-voltage signal at a modulation frequency under control of a signal generated by a local oscillator, the modulator apparatus comprising:
    a Gilbert-cell stage which supplies an output-voltage signal under the control of said signal generated by said local oscillator, the Gilbert-cell stage further including an output load for carrying out a current-to-voltage conversion and supplying the output-voltage signal; and
    a transconductor stage having:
    a voltage-to-current conversion module structured to perform a voltage-to-current conversion of said input-voltage signal and having a differential load;
    a differential feedback network configured for reproducing in a proportional way said input-voltage signal on the differential load, and
    a current-mirror module coupled to said voltage-to-current conversion module and configured for mirroring a current in the Gilbert-cell stage.

2. The apparatus according to claim 1 wherein said transconductor stage further comprises a common-mode feedback network configured for controlling an input of said voltage-to-current conversion module.

3. The apparatus according to claim 1 wherein said differential feedback network comprises a first differential amplifier configured for receiving said input-voltage signal through an impedance divider, outputs of said first differential amplifier being connected to said current-mirror module.

4. The apparatus according to claim 3 wherein said impedance divider is connected to said differential load.

5. The apparatus according to claim 2 wherein said common-mode feedback network comprises a second differential amplifier having inputs that receive common-mode-voltages collected from said common-mode feedback network, an output of said second differential amplifier controlling a biasing voltage of gates of common-gate transistors included in said voltage-to-current conversion module.

6. The apparatus according to claim 5 wherein said common-mode feedback network further comprises a first common-mode resistor connected to an input of said current-mirror module and a second common-mode resistor connected to an output of said current-mirror module wherein said common-mode feedback network collects said common-mode voltages on respective common-mode nodes.

7. The apparatus according to claim 1 wherein the transconductor stage and the Gilbert-cell stage are made with NMOS technology.

8. The apparatus according to claim 1 wherein the transconductor stage and the Gilbert-cell stage are included in an I/Q modulator.

9. The apparatus according to claim 1 wherein the transconductor stage and the Gilbert-cell stage are used for a procedure of conversion of signals to higher frequencies, or up-conversion.

10. The apparatus according to claim 1 wherein the transconductor stage and the Gilbert-cell stage are used for a procedure of conversion of signals to lower frequencies, or down-conversion.

11. A method of modulation operating at a low supply voltage, comprising:
    receiving an input-voltage signal in base band and supplying an output-voltage signal at a modulation frequency under control of a signal generated by a local oscillator;
    carrying out a voltage-to-current conversion of said input-voltage signal and an operation of mirroring of a current obtained;
    carrying out a frequency conversion via a Gilbert-cell stage under the control of said signal generated by said local oscillator;
    carrying out a current-to-voltage conversion and supplying the output-voltage signal; and
    applying a differential feedback for reproducing in a proportional way said input-voltage signal on a differential load that controls said voltage-to-current conversion.

12. The method according to claim 11, further comprises applying a common-mode feedback for controlling said voltage-to-current conversion.

13. The method according to claim 11 wherein applying said differential feedback comprises providing a differential amplifier for receiving said input-voltage signal through an impedance division and controlling the mirroring operation.

14. The method according to claim 13 wherein applying said differential feedback comprises associating in signal relationship said impedance division and said differential load.

15. The method according to claim 12 wherein applying said common-mode feedback includes supplying inputs of a second differential amplifier with common-mode voltages collected in said common-mode feedback, and controlling via said second differential amplifier a biasing gate voltage of common-gate transistors included in a voltage-to-current conversion module.

16. The method according to claim 11 wherein applying said differential feedback comprises directly controlling a differential voltage applied to gate electrodes of transistors that carry out said mirroring operation.

17. The method according to claim 11 wherein the method of modulation is used for a procedure of conversion of signals to higher frequencies, or up-conversion.

18. The method according to claim 11 wherein the method of modulation is used for a procedure of conversion of signals to lower frequencies, or down-conversion.

19. A transconductor circuit comprising:

a current mirror circuit configured to generate a differential current signal;

a first differential amplifier operable to receive a first voltage signal and generate an output signal to control the current mirror circuit;

a voltage-to-current conversion circuit to receive a second voltage signal proportional to the first voltage signal and convert the second voltage signal to a current signal; and a second differential amplifier operable to control the voltage-to-current conversion circuit.

20. The transconductor circuit of claim 19, further comprising a common-mode feedback circuit configured to control an input of the voltage-to-current conversion circuit.

21. The transconductor circuit of claim 20 wherein the first differential amplifier receives the first voltage signal via an impedance divider.

* * * * *